United States Patent [19]
Berra

[11] Patent Number: 5,459,660
[45] Date of Patent: Oct. 17, 1995

[54] CIRCUIT AND METHOD FOR INTERFACING WITH VEHICLE COMPUTER

[75] Inventor: Charles J. Berra, Troy, Mich.

[73] Assignee: Chrysler Corporation, Highland Park, Mich.

[21] Appl. No.: 172,495

[22] Filed: Dec. 22, 1993

[51] Int. Cl.⁶ .......................... G01M 15/00; G06F 13/00
[52] U.S. Cl. ................. 364/424.03; 364/431.12; 340/825.5; 73/117.3
[58] Field of Search .................. 364/424.03, 431.01, 364/424.1, 551.01, 580, 550, 238.2, 239, 240.8, 222.2, 238.2, 240.8, 431.12; 340/825.5, 825.57, 853.2; 73/117.3, 118.1; 324/511

[56] References Cited

U.S. PATENT DOCUMENTS

| | | | |
|---|---|---|---|
| Re. 31,582 | 5/1984 | Hosaka et al. | 364/431.04 |
| 4,207,611 | 6/1980 | Gordon | 364/580 |
| 4,234,921 | 11/1980 | Kinoshita et al. | 364/431.01 |
| 4,375,672 | 3/1983 | Kato et al. | 364/431.04 |
| 4,602,127 | 7/1986 | Neely et al. | 379/68 |
| 4,631,666 | 12/1986 | Harris et al. | 364/200 |
| 4,694,408 | 9/1987 | Zaleski | 384/551.01 |
| 4,706,082 | 11/1987 | Miesterfeld et al. | 340/825.5 |
| 4,719,458 | 1/1988 | Miesterfeld et al. | 340/825.5 |
| 4,739,323 | 4/1988 | Miesterfeld et al. | 340/525.5 |
| 4,739,324 | 4/1988 | Miesterfeld et al. | 340/825.5 |
| 4,742,349 | 5/1988 | Miesterfeld et al. | 340/825.5 |
| 4,748,843 | 6/1988 | Schafer et al. | 73/117.3 |
| 4,831,560 | 5/1989 | Zaleski | 364/551.01 |
| 4,853,850 | 8/1989 | Krass, Jr. et al. | 395/325 |
| 4,866,616 | 9/1989 | Takeuchi et al. | 364/424.04 |
| 4,875,391 | 10/1989 | Leising et al. | 477/155 |
| 5,107,428 | 4/1992 | Bethencourt et al. | 384/424.04 |
| 5,172,062 | 12/1992 | Eisermann | 304/503 |
| 5,214,582 | 5/1993 | Gray | 364/424.03 |
| 5,265,832 | 11/1993 | Wesling et al. | 246/169 R |
| 5,278,759 | 1/1994 | Berra et al. | 364/424.01 |
| 5,318,449 | 6/1994 | Schoell et al. | 364/431.04 |

OTHER PUBLICATIONS

SAE Technical Paper Series, No. 860389, "Chrysler Collision Detection (C²D)–A Revolutionary Vehicle Network", Frederick O. R. Miesterfeld, Feb. 24–28, 1986.
Chrysler 1983–1988 Instruction Manual, entire book, System 2000 Diagnostics.
3–in–1 Instruction Manual, Monitor 4000E, Apr. 1990, entire book.
SAE Standard J1850, Class B Data Communication Network Interface, Mar. 9, 1994.
ISO9141–2, International Standard, Road Vehicles—Diagnostic systems—Part 2; CARB requirements for interchange of digital information.
890529, The All–Adaptive Controls for the Chrysler Ultra Drive Transaxle, Maurice B. Leising, Howard Benford and Gerald L. Holbrook, Chrysler Motors Corp. Mar. 21, 1994.
Environmental Protection Agency, Feb. 19, 1993, 40 CFR Part 86 Control of Air Pollution From New Motor Vehicles; Final Rule, Federal Register, vol. 58, No. 32, pp. 9468–9488.

(List continued on next page.)

*Primary Examiner*—Kevin J. Teska
*Assistant Examiner*—Tan Nguyen
*Attorney, Agent, or Firm*—Mark P. Calcaterra

[57] ABSTRACT

An interface circuit for providing signals necessary to monitor one or more on-board vehicle computers through a serial communication link between an off-board controller and the on-board vehicle computer. The interface circuit is provided on the vehicle in order to provide the command signals to the off-board controller which will enable a standard monitoring device to read key information from the on-board vehicle computer. Additionally, the interface circuit also provides support of a second mode of operation that conforms to a proprietary communications protocol. The interface circuit automatically recognizes and adapts to the proper communication protocol for the tool sensed. The interface circuit complies with both a proprietary communication protocol and with an ISO 1941 format which satisfies an OBDII/CARB specification which all automobiles sold in the United States must comply with by the 1996 model year.

14 Claims, 3 Drawing Sheets

OTHER PUBLICATIONS

Resolution #93–40, State of California Air Resources Board, Amendments to Regulations Regarding On–Board Diagnostic System Requirements for 1994 and Later Passenger Cars, Light–Duty Trucks, and Medium–Duty Vehicles and Engines (OBD II).

CIRCUIT AND METHOD FOR INTERFACING WITH VEHICLE COMPUTER

BACKGROUND OF THE INVENTION

The present invention generally relates to on-board vehicle computer systems and, more particularly, to a system and method for monitoring on-board vehicle computer systems.

For over a decade, computers have been used on vehicles, such as automobiles and trucks, to control particular operations of one or more mechanical vehicle systems. In this regard, one of the first and still principal applications of vehicle computer technology has been to control various aspects of the engine used to drive the vehicle. In recent years, computers have also come to be used in a wide variety of vehicle systems, such as transmission systems, brake systems, suspension systems, operator control panels and even motorized seats. An example of one such computerized vehicle system is described in Leising et. al. U.S. Pat. No. 4,875,391, issued on Oct. 24, 1989, entitled "Electronically-Controlled, Adaptive Automatic Transmission System". This commonly assigned patent is hereby incorporated by reference. As described in this patent, the vehicle transmission system includes a computer circuit which controls a plurality of solenoid-actuated valves that regulate the flow of hydraulic fluid within the transmission.

Due to the complexity and inter-relationship between some of these vehicle systems, on-board computer communication systems have also been developed to enable data and other signals to be passed between particular vehicle computers. These communication systems typically include a plurality of wires which are connected to the vehicle computers in a particular electronic configuration, generally referred to as a "bus".

One example of an appropriate vehicle bus structure is represented by the Chrysler Collision Detection ("C$^2$D") Serial Data Bus. This technology is described in the following publications and patents: SAE paper No. 860389, entitled "Chrysler Collision Detection (C$^2$D)—A Revolutionary Vehicle Network", by Frederick O. R. Miesterfeld, 1986; SAE paper No. 890529, entitled "The All-Adaptive Controls for the Chrysler Ultradrive Transaxle", 1989; U.S. Pat. No. 4,706,082, entitled "Serial Data Bus For Intermodule Data Communications," which issued on Nov. 10, 1987; and U.S. Pat. No. 4,719,458, entitled "Method of Data Arbitration and Collision Detection In A Data Bus," which issued on Jan. 12, 1988; and U.S. Pat. No. 4,739,323, entitled "Serial Data Bus For Serial Communication Interface (SCI), Serial Peripheral Interface (SPI) and Buffered SPI Modes of Operation," which issued on Apr. 19, 1988; and U.S. Pat. No. 4,739,324, entitled "Method for Serial Peripheral Interface (SPI) in a Serial Data Bus," which issued on Apr. 19, 1988; and U.S. Pat. No. 4,742,349 entitled "Method for Buffered Serial Peripheral Interface (SPI) in a Serial Data Bus", which issued on May 3, 1988. These co-assigned patents and the identified publications are all hereby incorporated by reference.

In this regard, it should be noted that the engine controller and the transmission controller discussed in the above referenced U.S. Pat. No. 4,875,391 are both connected to the C$^2$D Serial Data Bus. This Serial Data Bus may also be accessible to off-board vehicle computers through one or more diagnostic connectors on the vehicle. In this regard, it should be appreciated that any vehicle bus structure needs to be accessible to off-board computer systems in order to permit the bus itself to be tested and permit direct access to and communication with any of the vehicle computers tied to the vehicle bus. An example of the use of an off-board diagnostic tool used to monitor and program an on-board vehicle computer is the Berra et. al. U.S. Pat. No. 5,278,759, issued on Jan. 11, 1994, and entitled "System and Method for Reprogramming a Vehicle Computer". This commonly assigned patent is hereby incorporated by reference.

In addition, one or more of these vehicle diagnostic connectors also typically provide separate communication links or channels with both the vehicle's engine control computer and the vehicle's transmission control computer. These separate communication links are generally designed to conduct serial communications directly with these particular on-board vehicle computers during certain diagnostic procedures.

In any event, diagnostic connectors have been employed since engine computers were first used on vehicles to permit communication between on-board and off-board computers. Thus, for example, data being gathered by the on-board vehicle computer from various sensors (such as engine speed and manifold pressure) may be transmitted to an off-board computer for programmed or operator analysis.

In response to the heavy reliance on on-board computers, combined with a variety of systems employed by the various automobile manufacturers, future vehicles sold in the United States will soon have to provide a standardized diagnostic interface. This restriction is referred to as the OBDII/CARB requirement and includes new vehicles beginning in 1994 model year and all vehicles in the 1996 model year. The OBDII/CARB requirement offers a choice between a J1850 specification and an ISO9141 specification. The OBDII requirement, the J1850 standard, and the ISO9141 are hereby incorporated by reference.

Accordingly, it is a principal objective of the present invention to provide an advanced system and method for interfacing an on-board vehicle computer with a hand held diagnostic tool.

It is a more specific objective of the present invention to provide an advanced system and method for interfacing an on-board vehicle computer with a hand held diagnostic tool that is compatible with an existing proprietary communication system.

It is another objective of the present invention to provide an advanced system and method for interfacing an on-board vehicle computer with a hand held diagnostic tool that is additionally compatible with an ISO9141 specification which satisfies an OBDII/CARB requirement.

It is yet another objective of the present invention to provide an advanced system and method for interfacing an on-board vehicle computer with a hand held diagnostic tool that automatically recognizes and adapts to a proprietary communication system or an ISO9141 compatible system depending on which system is connected to the on-board vehicle computer.

SUMMARY OF THE INVENTION

To achieve the foregoing objectives, the present invention provides a system and method for providing signals necessary to monitor one or more on-board vehicle computers through a serial communication link between an off-board controller and the on-board vehicle computer. The interface circuit is provided on the vehicle in order to provide the command signals which will enable a standard monitoring device to read key information from the on-board vehicle computer. The interface circuit complies with both a proprietary diagnostic tool and with an ISO9141 format which satisfies an OBDII/CARB specification to which all automobiles sold in the United States must comply with by the 1996 model year.

In one form of the present invention, the off-board controller is comprised of a diagnostic tool which includes a portable housing, a computer based control circuit contained in the housing and a plug-in memory module which is removably secured to the portable housing. The communication link between the diagnostic tool and the vehicle signal transfer structure is provided by a cable structure that includes an in-line adapter for providing the voltage level required for at least one of the command signals. The cable structure is removably connected to the diagnostic connector of the vehicle which provides access to the vehicle signal transfer structure.

Additional features and advantages of the present invention will become more fully apparent from a reading of the detailed description of the preferred embodiment and the accompanying drawings in which:

DETAILED DESCRIPTION OF THE PREFERRED EMBODIMENTS

Figure 1:
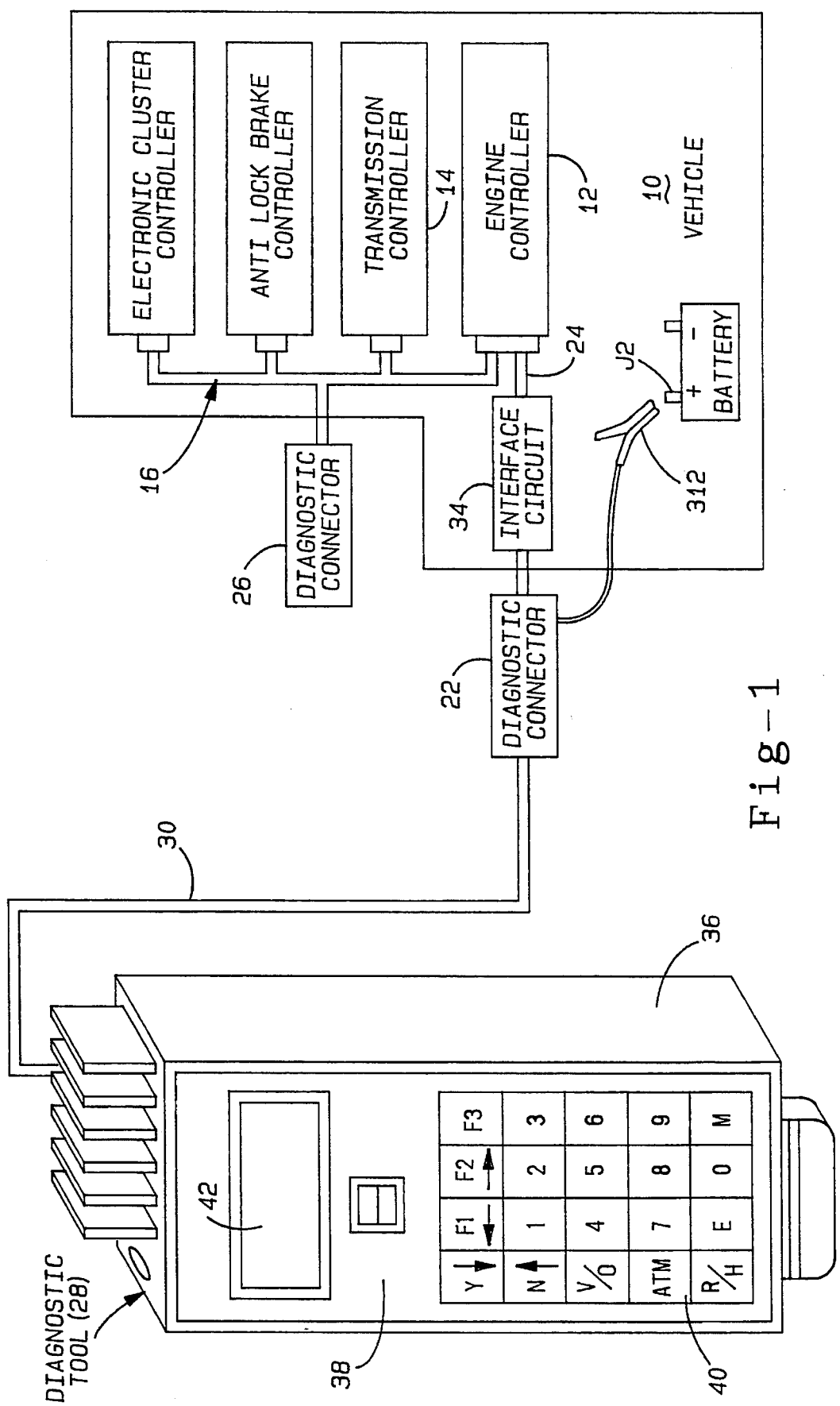
FIG. 1 is a diagrammatic representation of a portable diagnostic tool and serial communication link that may be utilized to monitor the functions of an onboard computer in accordance with the present invention.

Referring to FIG. 1, a vehicle 10 is shown generally represented as a large block which includes a plurality of on-board vehicle computer circuits, such as an engine controller 12 and an automatic transmission controller 14. Each of these on-board vehicle computer circuits or controllers are connected to a common vehicle signal transfer structure 16 which could include, for example, the Chrysler Collision Detection Serial Data Bus discussed above. The signal transfer structure 16 may also include individual serial communications links to on-board vehicle computer circuits that are not part of a shared or common bus structure for all on-board vehicle computer circuits. In any event, it should be appreciated that a variety of suitable vehicle signal transfer structures may be employed to permit communication with computer circuits on the vehicle 10, and that the principles of the present invention are not limited to any particular vehicle signal transfer structure.

A diagnostic connector 22 is connected to the engine controller 12 through the vehicle signal transfer structure 16. The diagnostic connector 22 includes electrical conduits which lead directly to the engine controller 12. In this regard, the cable 24 leading from the diagnostic connector 22 to the signal transfer structure 16 provides a bi-directional communication channel between the engine controller 12 and an off-board computer. FIG. 1 also shows a body diagnostic connector 26 which provides access to the $C^2D$ bus of the vehicle signal transfer structure 16.

FIG. 1 also shows a diagnostic tool 28 which is connected to the diagnostic connector 22 through a cable structure 30. The diagnostic tool 28 is preferably either a DRB Diagnostic Readout Box that is commercially available to Chrysler dealerships (e.g. a DRB II tool), as illustrated in FIG. 1, or another ISO9141 compatible communication tool.

The DRB II diagnostic unit 28 includes a portable housing 36 which may be hand held near or in the vehicle 10 by a service technician. The front panel 38 of the DRB II unit includes a keypad 40 for entering data or instructions in an interactive communication process with the DRB II unit. In this regard, the DRB II unit includes a display 42 which is capable of visibly displaying several lines of character and numeric information. Thus, for example, the DRB II unit may prompt the service technician to enter particular information from the keypad 40 by producing a specific request on the display 42. A connector 312 is connected to a positive battery terminal J2 to supply voltage to the DRBII diagnostic tool 28 through the diagnostic connector 22.

Figure 2:
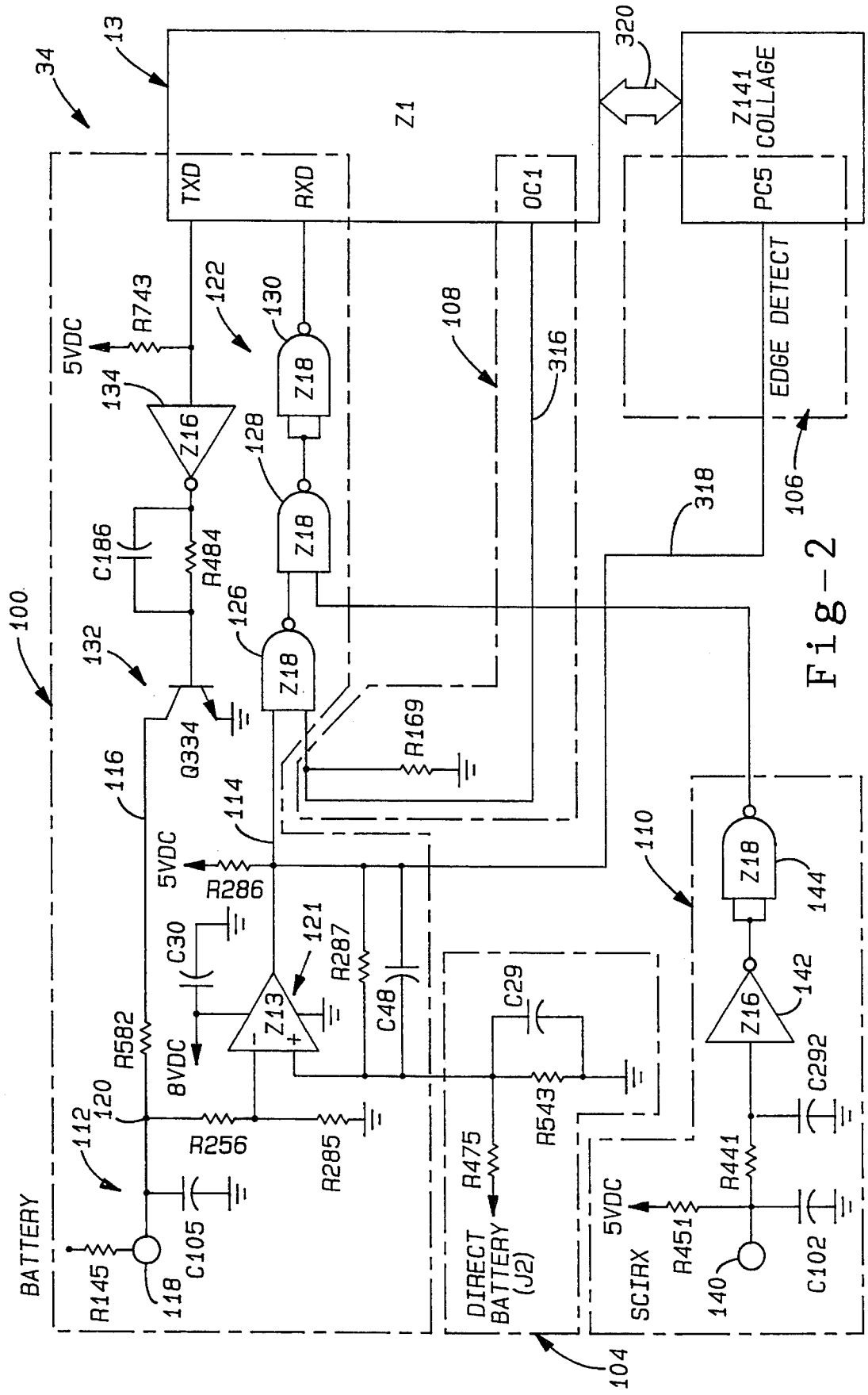
FIG. 2 is a circuit diagram which illustrates a portion of the diagnostic interface circuit as provided by the system shown in FIG. 1.

Shown in FIG. 2 is interface circuit 34 for a portion of the engine controller 12. Circuit 34 is preferably resident in the engine controller 12 circuitry and is used for processing command signals from the diagnostic tool 28. A microprocessor 13 is shown which is generally included in the engine controller 12. The interface circuit 34 is generally comprised of a bi-directional communications bus 100, an input section 112, battery reference circuitry 104, edge detect logic 106, feedback filtering logic 108, and a serial receive bus 110.

More particularly, the bi-directional communication bus 100 generally comprises an input section 112, a receive bus path 114, and a transmit bus path 116. Bi-directional communication bus 100 is used to provide communications between the diagnostic connector 22 and the engine controller 12. While the circuitry of the bi-directional communication bus 100 internally provides independent transmit and receive paths, the bus 100 is considered to be bi-directional from an external viewpoint, since all data is transmitted through a common input section 112.

The input section 112 includes an interface connector 118, a capacitor C105, the receive bus path 114, and the transmit bus path 116. The interface connector 118 is connected to a node 120, which in turn, is connected to both the receive bus path 114 and the transmit bus path 116. Capacitor C105 provides an AC coupling to ground for noise reduction purposes.

The receive bus path 114 generally includes a comparator section 121 and receive logic section 122. The comparator section 121 includes a comparator Z13, a resistor R256, a resistor R285, and a capacitor C30. The comparator Z13 is preferably comprised of an LM2901 operational amplifier. Resistors R256 and R285 are connected in a voltage divider configuration for providing an input to the inverting input of comparator Z13. A reference voltage to the non-inverting input of comparator Z13 is provided by the battery reference circuitry 104.

Receive logic 122 includes logic NAND gates 126, 128, and 130. NAND gate 126 receives a first input from an output of comparator Z13, and a second input from transmit logic section 132. The output of NAND gate 126 provides a first input to NAND gate 128. A second input to NAND gate 128 is provided by a second receive bus 110. NAND gate 130 has a first and second input both of which are coupled to the output of NAND gate 128. Therefore, NAND gate 130 is configured in a digital inverter mode and provides a signal to the input port RXD of the microprocessor 13.

The transmit bus path 116 includes transmit logic section 132, a resistor R582, and a resistor R743. Resistor R743 provides a DC reference to transmit logic 132. Transmit logic 132 is coupled to input section 112 through resistor R582. Transmit logic section 132 also includes a transistor Q334, a resistor R484, a capacitor C186, and a digital inverter 134. Transistor Q334 is configured, with resistor R484 and capacitor C186, in a tri-state mode. When transistor Q334 is "on", a data "low" signal is supplied from the output TXD port of the microprocessor 13 to the input section 112. When transistor Q334 is "off", a data "high" signal is supplied from the output TXD port of the microprocessor is to the input section 112.

The battery reference circuitry 104 includes an input line 314 connected to the positive battery terminal J2 of the automobile 10, as well as resistors R475 and R543, and a capacitor C29. Resistors R475 and R543 are configured as a voltage divider to provide an output equal to one quarter of the battery input voltage. This output is fed to the non-inverting input of the comparator section 121. The battery reference circuitry 104 operates in conjunction with battery line 141, resistor R145, resistor R256, and resistor R285 to provide a variable reference point that compensates for variances in the battery voltage. The inverting input to the comparator section 121 is approximately equal to the battery voltage divided by two. The non-inverting input to the comparator section 121 is the battery voltage divided by four. The output state of the comparator section 121 is determined by the difference between these two voltages. This configuration reduces the effect of battery variances in order to provide an accurate determination between the two modes of operation of the interface circuit 34.

The serial receive bus path 110 includes an interface connector 140, a resistor R451, a resistor R441, a capacitor C102, a capacitor C292, an inverter 142 and a NAND gate 144. Interface connector 140 is coupled to inverter 142 through resistor R441. Capacitors C102 and C292 provide AC-coupling to signals transmitted along receive bus path 110 for noise reduction purposes. The output of inverter 142 is connected to the first and second inputs of the NAND gate 144. With this configuration, it should be appreciated that the NAND gate 144 operates as another inverter. The output of NAND gate 144 provides an input to NAND gate 128 of the receive logic 122. The serial receive bus path 110 provides one half of a full duplex communication bus when the interface circuit 34 is operating in an SCI II mode. The SCI II mode is a full duplex communications protocol for communication between an on-board vehicle computer and an external communications tool.

The feedback filtering logic 108 includes a control line 316 connecting the output compare port OC1 of the engine controller 12 to a resistor R169 as well as a second input to NAND gate 126 of the receive logic 122. Resistor R169 provides a DC reference to ground.

Edge detect logic 106 includes an input line 318 to a PC5 port of a collage chip Z141. The collage chip Z141 is a collection of components built to the specification of the assignee of the present invention. The individual components are not proprietary, but are manufactured on a single integrated circuit to save space. The collage chip Z141 has a bus 320 connected to the microprocessor 13. The collage chip Z141 uses the information from bus 320 to access the PC5 port which reflects the status of the edge detect logic 106. The PC5 port is directly coupled to a second input of NAND gate 126 of the receive logic 122.

Figure 3:
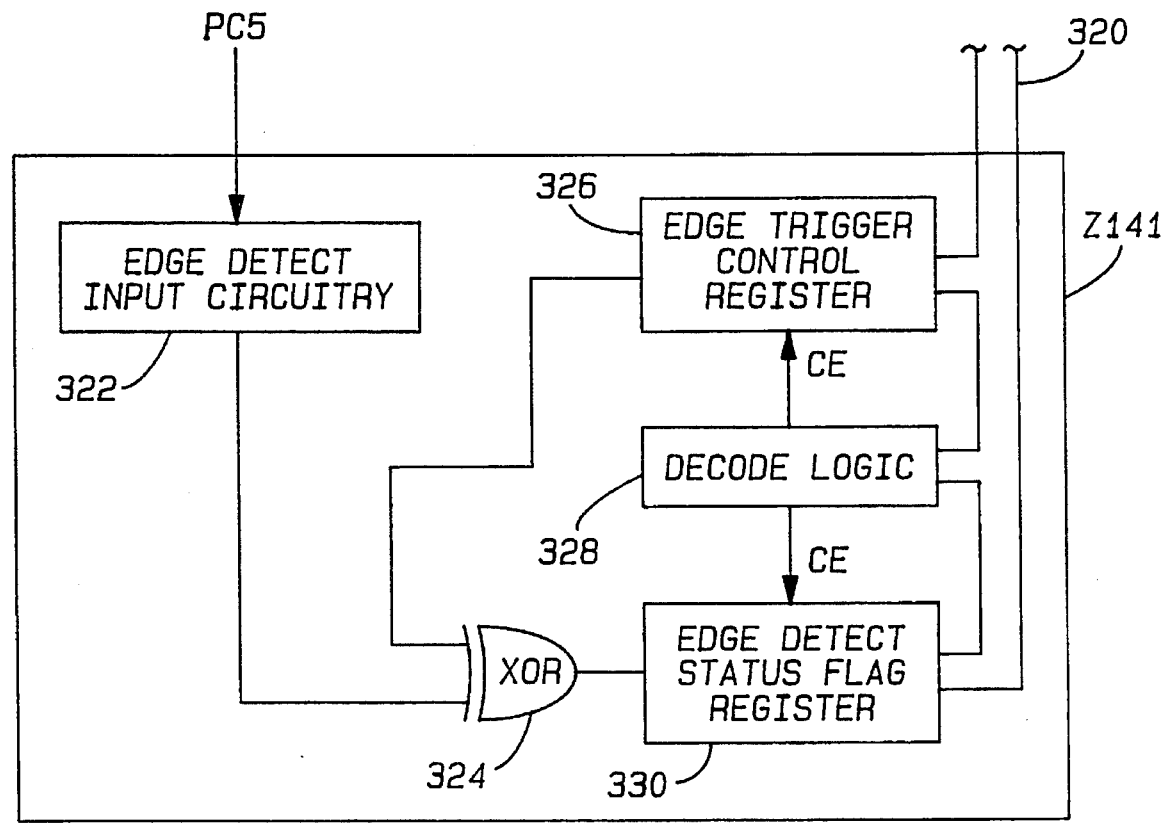
FIG. 3 is a schematic diagram illustrating relevant components of the collage chip shown in FIG. 2.

The edge detect logic 106, in combination with the filtering logic 108, provides the necessary intelligence to enable the interface circuit 34 to sense either a proprietary DRB-II diagnostics tool or an ISO9141 compatible diagnostics tool and shift automatically into either SCI II mode or ISO9141 mode, depending upon the mode being utilized by the tool. The Z141 collage chip, illustrated in greater detail in FIG. 3, receives an input signal on line 318 through input port PC5. The input signal is passed to edge detect input circuitry 322 which buffers the input signal and senses a logic level change from either "high" to "low" or "low" to "high". The output signal from edge detect input circuitry 322 is then exclusive ORed at exclusive OR gate 324 with a signal output from an edge trigger control register 326 which enables the detection of the logic level transition of either a "rising" edge or "falling" edge. A status flag register 330, in cooperation with trigger control register 326 and decode logic circuitry 328, are used to detect a desired transition and then latch to the new state. The status flag register 330 confirms that a transition has taken place. Decode logic 328 enables the edge trigger control register 326 to be either read or written to and directs information onto bus 320.

Upon coming out of a reset condition, the output compare port OC1 from the microprocessor 13 is in a "low" state. This effectively disables any ISO9141 communications from reaching the microprocessor 13 receive input port RXD by disabling the ability at the NAND gate 126 to produce a "low" digital output state. At the same time, the microprocessor 13 transmit output port TXD idles at a digital "high" state, which effectively puts the transmit bus 116 in a tri-state, or inactive state with transistor Q334 being off. Assuming no test tool is connected, the edge detect logic 106 will be in a "high" state.

When an ISO9141 test tool is connected, resistor 145 is supplied with approximately battery potential. This reference battery potential is divided by two by resisters R256 and R285 and sent to the inverting input of the comparator section 121. The edge detect input port PC5 will sense a "low" signal from the comparator section 121. Based on these signals, the interface circuit 34 automatically recognizes an ISO9141 compatible diagnostic tool has been connected and shifts into the appropriate mode. The receive input port RXD continues to be in its initially disabled state caused by output compare port OC1. The diagnostic tool will send an identifier byte at 5 baud. If the microprocessor recognizes the identification based on the PC5 input sense of the collage, output compare port OC1 will be driven "high" and the receive bus path 114 will be enabled allowing data to pass to the microprocessor 13. From this point, output compare port OC1 will idle in a "high" state and ISO9141 messages will continue to be received by the microprocessor 13.

When the microprocessor 13 desires to transmit a message to the diagnostics test tool 28, the receive logic 122 filters out an echo created by the single-wire bi-directional configuration of the ISO9141 bus. This is accomplished by using output compare port OC1 to hold a "low" value for a period slightly longer than the length of the data transmission. Just prior to the SCI transmit, the output compare port OC1 toggles "low", disabling the receive bus path 114 from sensing the transmission. Shortly after the data transmission is complete, the output compare port OC1 toggles times out and "high", thereby re-enabling the receive bus path 114. This filtering process relieves the microprocessor 13 from clearing its internal receive register.

In the SCI II mode the initial reset status of the interface circuit 34 is identical to the reset status while in the ISO9141 mode of operation. The transmit output port TXD from the microprocessor 13 idles in a "high" state causing the transmit bus 116 to remain in a tri-state level. The output compare port OC1 idles in a "low" state to disable any messages from the transmit output port TXD from accessing the input port RXD of the microprocessor 13. The edge detect logic 106 will idle "high" when the interface circuit 34 is in the SCI II mode. The SCI II communication tool operates at a 5 V DC level which will not be sensed through the comparator circuitry 121, provided the battery voltage is above 10 volts DC.

The input port RXD of the microprocessor 13 will also be accessed by the DRB II when the interface circuit 34 is operating in the SCI II mode. Accordingly, the SCI II mode will operate in a full duplex SCI communications scheme.

The interface circuit 34 will also operate in a bootstrap mode, when necessary, to reprogram microprocessor 13 in a manner like that discussed in the referenced patent entitled "System and Method for Reprogramming a Vehicle Computer". In the bootstrap mode, the microprocessor 13 awakens out of reset into a predetermined initialization sequence controlled by an internal bootstrap ROM. An algorithm contained on this bootstrap ROM configures output compare port OC1 to a "low" state, effectively disabling any SCI transmittal from echoing back to the input port RXD of the microprocessor 13. The edge detect circuitry 106 is not utilized at all in the bootstrap mode. The SCI configuration of the microprocessor 13 in the bootstrap mode is compatible with the DRB II diagnostic communication tool 28.

The bootstrap algorithm communicates with the DRB II diagnostic communication tool 28 in a download fashion. After the engine controller 12 transmits a break signal, it waits to receive an executable program from the diagnostic tool 28. The diagnostic tool 28 begins sending one byte at a time, which the microprocessor 13 receives, stores in RAM, and transmits back to the diagnostic tool 28. Upon receiving the entire algorithm from the diagnostic tool 28, the microprocessor 13 jumps to the beginning of the RAM address and begins executing the downloaded code.

In an effort to increase clarity in the circuits shown in FIG. 2, the values for the various components were not included thereon. However, for sake of completeness, these component values are listed below:

| Component | Value |
|-----------|-------|
| C105 | 470 pF |
| R256 | 27 k |
| R285 | 27 k |
| R582 | 82 Ω |
| C30 | 0.1 μF |
| R286 | 2.2 k |
| R287 | 75 k |
| Z13 | LM2901 |
| C48 | 150 pF |
| C29 | 0.001 μF |
| R543 | 13 k |
| R475 | 39 k |
| R451 | 10 k |
| R441 | 10 k |
| C102 | 0.001 μF |
| C292 | 33 pF |
| Z16 | 74HC14 |
| Z18 | 74HC00 |
| R169 | 10 k |
| Q334 | 2N4401 |
| R484 | 2.7 k |
| C186 | 0.001 μF |
| R743 | 4.7 k |
| Z1 | 68HC16 |

The present invention has been described in an illustrative manner. In this regard, it is evident that those skilled in the art once given the benefit of the foregoing disclosure, may now make modifications to the specific embodiments described herein without departing from the spirit of the present invention. Such modifications are to be considered within the scope of the present invention which is limited solely by the scope and spirit of the appended claims.

What is claimed is:

1. An interface circuit for automatically providing bi-directional communication with at least one on-board vehicle computer under a plurality of different communication protocols, comprising:

bi-directional communication means for enabling communication under a first communication protocol;

full duplex communication means for enabling communication under a second communication protocol, said full duplex communication means having a receive bus and a complimentary transmit bus;

edge-detect means for distinguishing between identification data and communication data, said edge-detect means having an input;

comparator means having a first input for receiving a voltage reference, a second input for receiving a data input and an output coupled to said input of said edge-detect means, said comparator means and edge-detect means changing a mode of communication between said first communication protocol and said second communication protocol; and feedback means coupled to the bi-directional communication means for enabling reception of incoming messages while filtering a local echo of a transmitted message.

2. The interface circuit according to claim 1, wherein said interface circuit further includes an input power conditioning means for providing a reference battery voltage to the first input of the comparator means compensating for battery variances.

3. The circuit according to claim 2, wherein said battery variances range between 8 and 16 Volts DC.

4. The circuit according to claim 1, wherein said bi-directional communication means conforms to an ISO9141 specification.

5. The circuit according to claim 1 wherein said bi-directional communication means also provides said receive bus of said full duplex communication means.

6. A method of communicating information between an onboard vehicle computer and a proprietary monitoring and programming device using a first protocol and for communicating information between said on-board vehicle computer and a second monitoring device using a second protocol, comprising the steps of:

providing a first communication protocol using a bi-directional communication bus;

providing a second communication protocol using said bi-directional communication bus for an omni-directional receive bus and a second bus for a complimentary omni-directional transmit bus;

distinguishing between an identification message and a communication data packet and providing an output which is indicative of the distinguished message or data;

switching automatically between said first communication protocol and said second communication protocol as a result of said output; and enabling reception of incoming messages while filtering a local echo of a transmitted message.

7. The method according to claim 6, wherein said second communication protocol conforms to an ISO 9141 standard.

8. An interface circuit for providing bi-directional communication with at least one on-board vehicle computer under a plurality of different communication protocols, said interface circuit comprising:

bi-directional communication means for providing communication under a first communication protocol:

full duplex communication means for providing communication under a second communication protocol, said full duplex communication means including an omni-directional receive bus and a complementary omni-directional transmit bus;

means for detecting connection of a diagnostic tool to the interface circuit and selecting one of the communication protocols for said. diagnostic tool; and feedback means coupled to the bi-directional communication means for enabling reception of incoming messages while filtering a local echo of a transmitted message.

9. The circuit according to claim 8 wherein said bi-directional communication means also provides said receive bus of said full duplex communication means.

10. The interface circuit as defined in claim 8 wherein the means for detecting connection of a diagnostic tool to the interface circuit and selecting one of the communication protocols comprises:

a comparator for comparing a data input with a predetermined threshold and providing an output; and edge-detector means having an input coupled to the output of the comparator, said comparator and edge-detector means distinguishing between identification data and communication data so as to select a mode of communication between the first communication protocol and the second communication protocol.

11. The interface circuit as defined in claim 8 wherein said first communication protocol conforms to an ISO9141 specification.

12. The interface circuit as defined in claim 8 wherein the second communication protocol conforms to an SCI specification.

13. An interface circuit for providing bi-directional communication with at least one on-board vehicle computer under a plurality of different communication protocols, said interface circuit comprising:

bi-directional communication means for providing communication under a first communication protocol;

full duplex communication means for providing communication under a second communication protocol, said full duplex communication means including a receive bus and a transmit bus for handling said second communication protocol, and said receive bus being provided via said bi-directional communication means; and means for detecting connection of a diagnostic tool to the interface circuit and selecting one of the communication protocols for said diagnostic tool.

14. The interface circuit as defined in claim 13 further comprising feedback means coupled to the bi-directional communication means for enabling reception of incoming messages while filtering a local echo of a transmitted message.

* * * * *